(12) United States Patent
Liao et al.

(10) Patent No.: US 8,187,009 B2
(45) Date of Patent: May 29, 2012

(54) HIGH DENSITY ELECTRICAL CONNECTOR

(75) Inventors: Fang-Jwu Liao, Tu-Cheng (TW); Hung-Yang Yeh, Tu-Cheng (TW)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 0 days.

(21) Appl. No.: 12/951,078

(22) Filed: Nov. 22, 2010

(65) Prior Publication Data

US 2011/0124236 A1     May 26, 2011

(30) Foreign Application Priority Data

Nov. 20, 2009   (TW) ................................ 98221600 U

(51) Int. Cl.
*H01R 12/00* (2006.01)
(52) U.S. Cl. ........................................................ 439/83
(58) Field of Classification Search ................ 439/70, 439/71, 66, 83, 342, 246, 862
See application file for complete search history.

(56) References Cited

U.S. PATENT DOCUMENTS

| | | | |
|---|---|---|---|
| 6,905,377 B2 * | 6/2005 | Murr | 439/862 |
| 7,264,486 B2 | 9/2007 | Ma | |
| 7,297,010 B2 * | 11/2007 | Tsai | 439/331 |
| 2009/0280689 A1 * | 11/2009 | Lin et al. | 439/625 |

* cited by examiner

*Primary Examiner* — Tulsidas C Patel
*Assistant Examiner* — Phuongchi T Nguyen
(74) *Attorney, Agent, or Firm* — Andrew C. Cheng; Wei Te Chung; Ming Chieh Chang

(57) ABSTRACT

An electrical connector includes an insulative housing and a number of electrical contacts secured to the insulative housing. Each of the contacts includes a flat plate engaging with the insulative housing, a spring arm bending and extending upwardly from a side edge of the flat plate and a solder tail extending downwardly from a lower portion of the flat plate. The spring arm has a first vertical portion connected with the body plate, an arc portion bending and extending upwardly from the first vertical portion, and a contact portion at a free end of the spring arm. Said arc portion and contact portion are located at same side of the first vertical portion.

7 Claims, 5 Drawing Sheets

HIGH DENSITY ELECTRICAL CONNECTOR

BACKGROUND OF THE INVENTION

1. Field of the Invention

The present invention relates to an electrical connector, and more particularly to an electrical connector mounted on a printed circuit board.

2. Description of Related Art

China patent application publication No. CN1953277A discloses an electrical connector mounted to a printed circuit board and electrical connected with a process package. The electrical connector includes an insulative housing with a plurality of passageways and a plurality of electrical contacts attached to the passageways of the insulative housing, respectively. The contacts each has retaining portion engaging with the passageway, a contacting portion extending upwardly from the retaining portion, a spring portion extending from lower end of the retaining portion, and a horizontal solder portion for soldering on the printed circuit board. The spring portion is bent from the retaining portion and used to enhance flexibility of the electrical contact. The spring portion is located between the retaining portion and the solder portion which can not increase the flexibility evidently. In addition, length of the contact portion also could be extended for increasing the flexibility. However, this design causes width of the contact increased and is not benefit for high density of the electrical connector.

An improved electrical connector that overcomes the above-mentioned problems is desired.

BRIEF SUMMARY OF THE INVENTION

An object of the present invention is to provide an electrical connector with high density electrical contacts.

An electrical connector comprises an insulative housing and a plurality of electrical contacts secured to the insulative housing. Each of the contacts includes a flat plate engaging with the insulative housing, a spring arm bending and extending upwardly from a side edge of the flat plate and a solder tail extending downwardly from a lower portion of the flat plate. The spring arm has a first vertical portion connected with the body plate, an arc portion bending and extending upwardly from the first vertical portion, and a contact portion at a free end of the spring arm. Said arc portion and contact portion are located at same side of the first vertical portion.

An electrical connector comprises an insulative housing and a plurality of electrical contacts secured to the insulative housing. Each of the contacts includes a flat plate engaging with the insulative housing, a spring arm bending and extending upwardly from a side edge of the flat plate and a solder tail extending downwardly from a lower portion of the flat plate. The spring arm has a first vertical portion connected with the body plate, a bending portion connected with the first vertical portion, a second vertical portion extending from the bending portion and a contact portion extending obliquely from the second vertical portion. The first vertical portion and the second vertical portion are located on a same line.

Other objects, advantages and novel features of the invention will become more apparent from the following detailed description of the present embodiment when taken in conjunction with the accompanying drawings.

DETAILED DESCRIPTION OF THE PREFERRED EMBODIMENT

Figure 1:
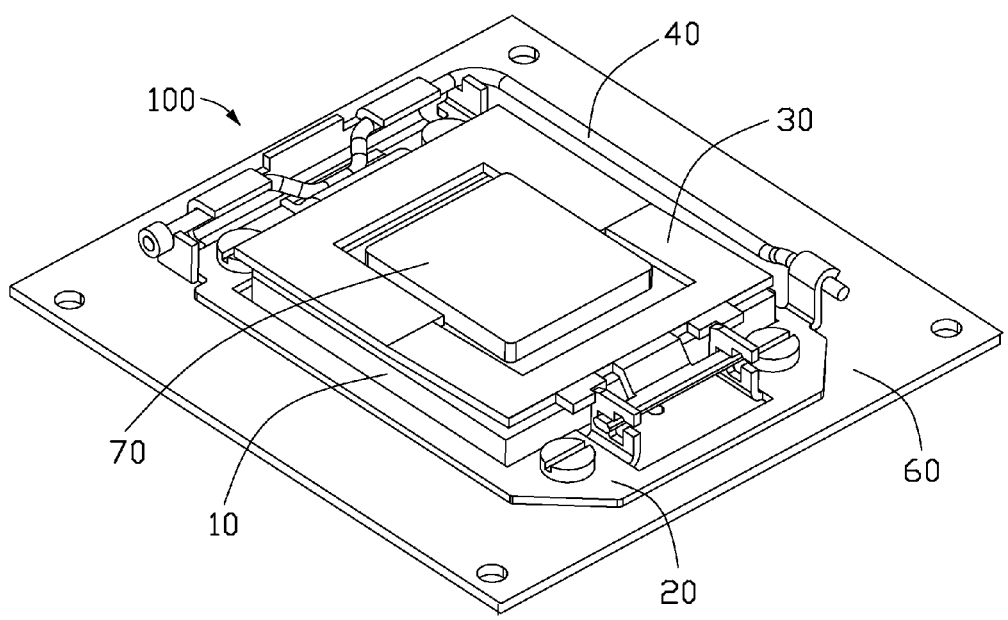
FIG. 1 is an assembled perspective view of an electrical connector according to a preferred embodiment of the present invention.

Reference will be made to the drawing figures to describe the present invention in detail, wherein depicted elements are not necessarily shown to scale and wherein like of similar elements are designated by same or similar reference numeral through the several views and same or similar terminology.

Figure 2:
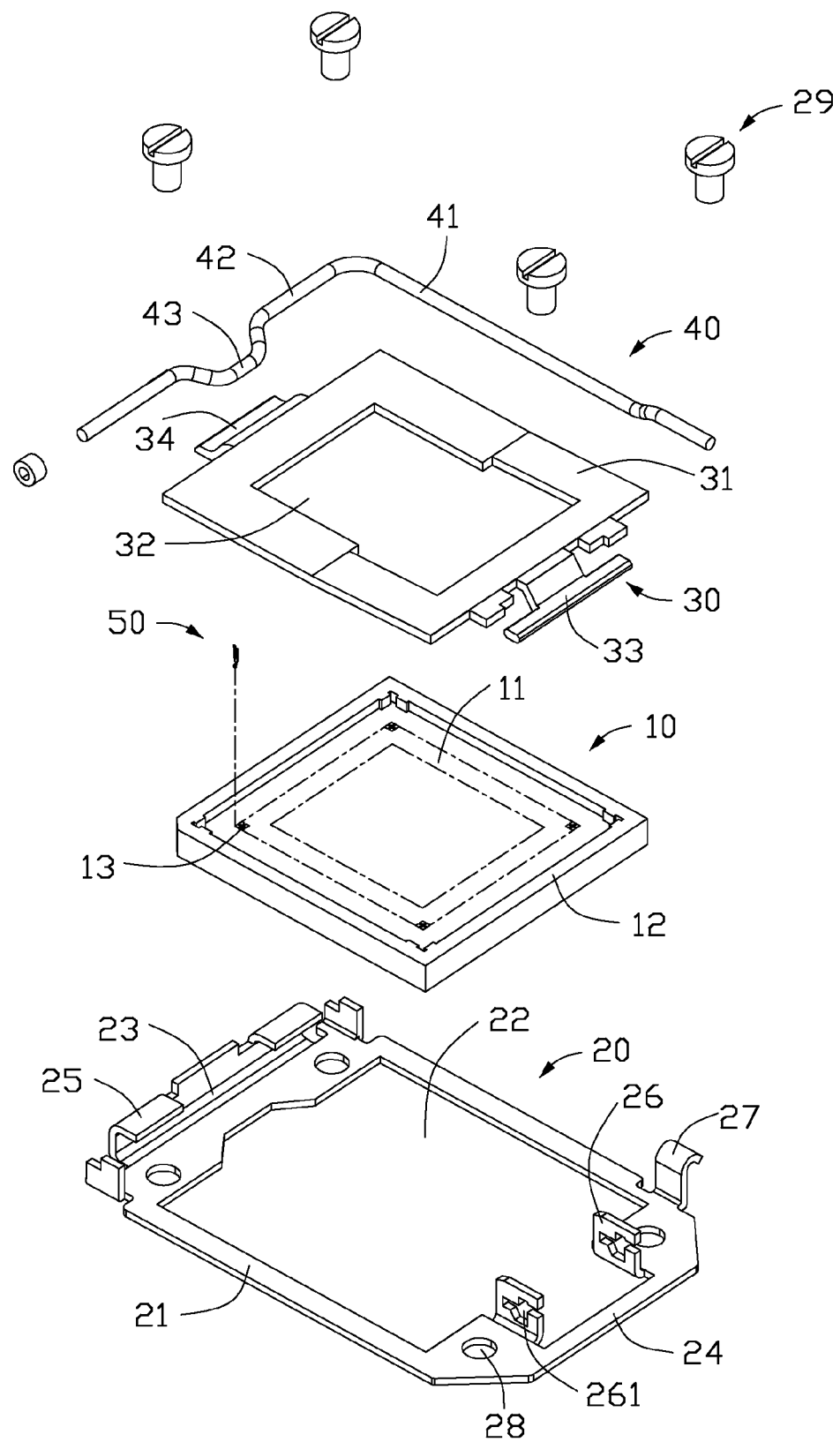
FIG. 2 is an exploded perspective view of the electrical connector shown in FIG. 1.

Please referring to FIGS. 1-2, the electrical connector 100 according to a preferred embodiment of the present invention is used to electrical connect a package 70 with a printed circuit board 60 and comprises an insulative housing 10, a plurality of electrical contacts 50 secured to the insulative housing 10, a stiffener 20 located at outer side of the insulative housing 10, a load plate 30 rotatably mounted to one end of the stiffener 20, and a load lever 40 rotatably mounted to the other end of the stiffener 20. The load plate 30 is used to press the package 70 on the insulative housing 10 and secured to the stiffen 20 by the load lever 40.

With reference to FIG. 2, the stiffener 20 has a bottom wall 21 with an opening 22 for receiving the insulative housing 10 and a first connect portion 23 and a second connect portion 24 located at opposite sides of the bottom wall 21. A plurality of through holes 28 are defined on the corners of the bottom wall 21 for a plurality of screws 29 passing through and securing the stiffener 20 on the printed circuit board 60. The first connect portion 23 has a pair of first tabs 25 for securing the load lever 40. A pair of second tabs 26 bent from the second connect portion 24 and each defines a receiving slot 261. The second connect portion 24 has a latch 27 for securing the load lever 40 on the stiffener 20.

The load plate 30 has a top wall 31 with an opening 32, a tongue portion 34 located at one side of the top wall 31, and a rotating shaft 33 located at the other side of the top wall 31. The rotating shaft 33 is received in the pair of receiving slots 261 of the stiffener 20 so that the load plate 30 rotates relative to the stiffener 20 from an open position to a closed position. The load lever 40 includes a driving portion 41 and a pressing portion 42 perpendicular to the driving portion 41. The pressing portion 42 is rotatably secured to the first tabs 25 and has a project portion 43 for pressing the load plate 30.

The insulative housing 10 comprises a base portion 11 which defines a conducting region and a plurality of sidewalls 12 extending upwardly from the base portion 11. A plurality of passageways 13 extend through the base portion 11 for receiving the electrical contacts 50.

Figure 3:
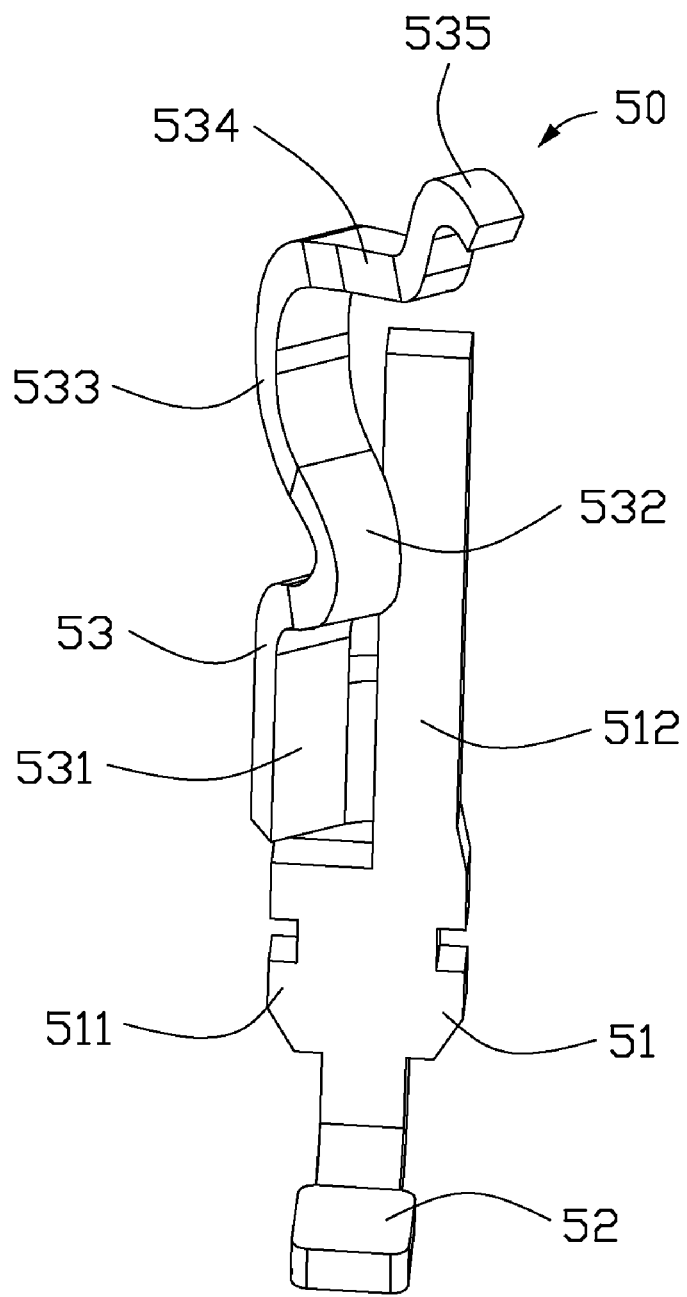
FIG. 3 is a perspective view of the electrical contact shown in FIG. 2.
Figure 4:
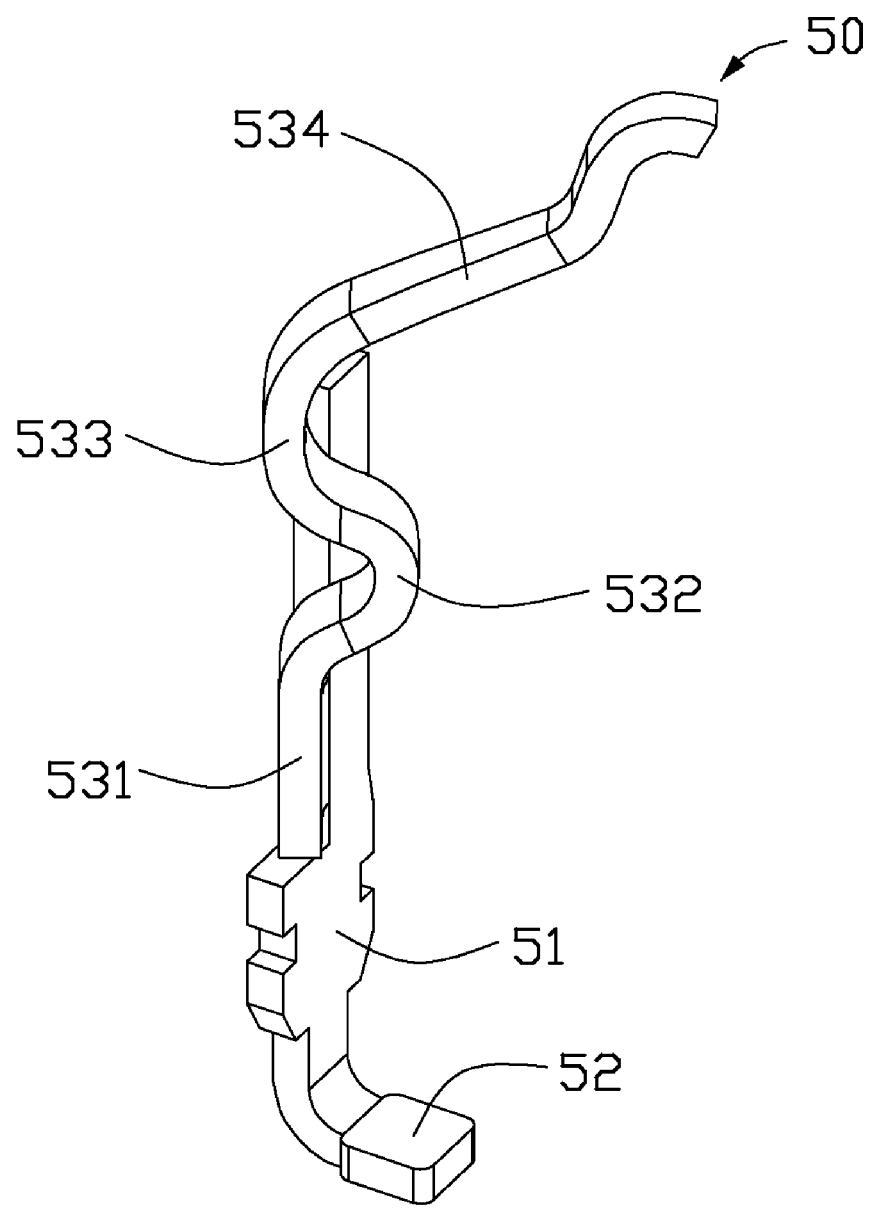
FIG. 4 is similar to FIG. 3 but taken form a different angle.
Figure 5:
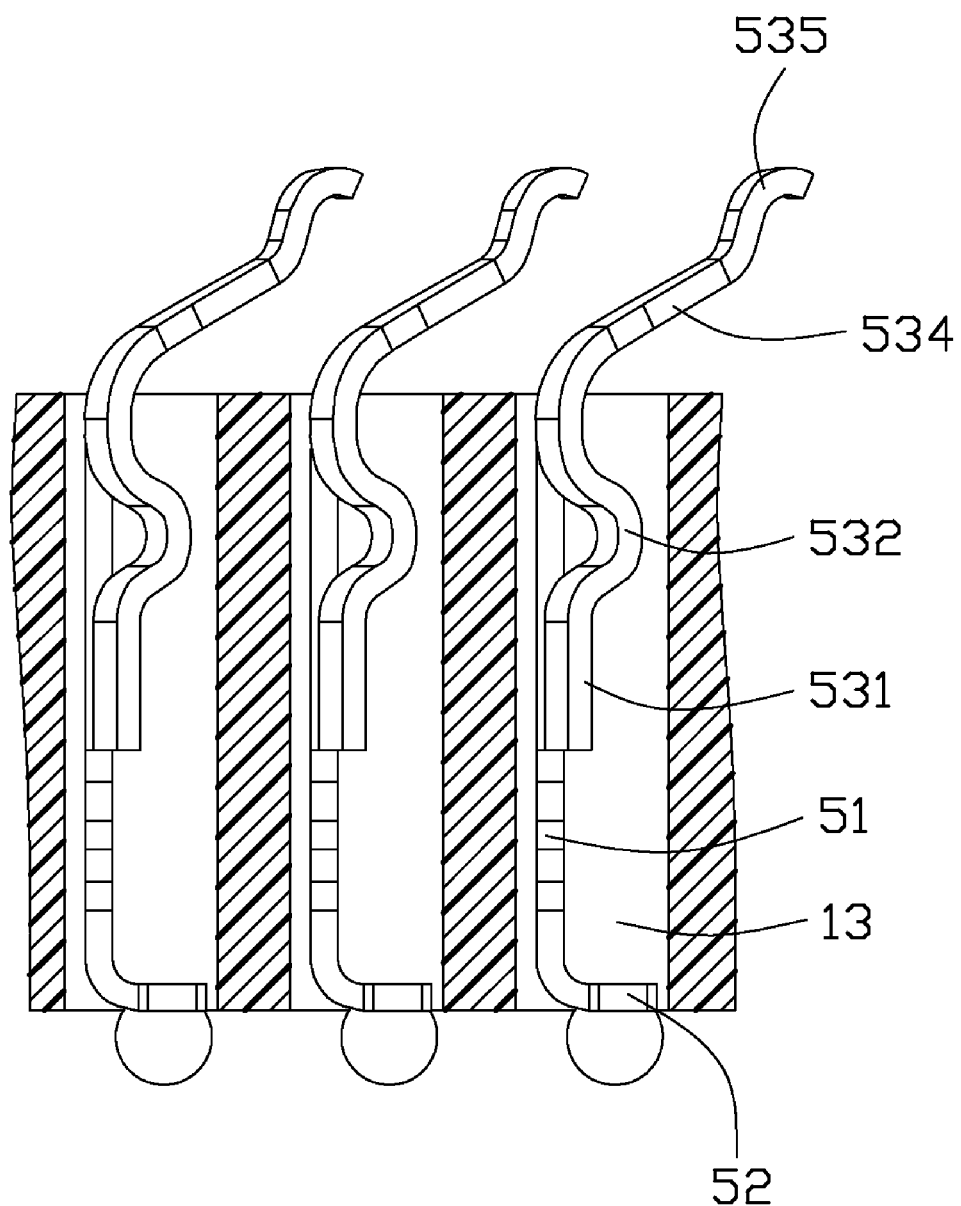
FIG. 5 is cross-sectional view of the electrical connector.

Please referring to FIGS. 3-5, each of the electrical contacts 50 includes a flat plate 51 engaging with the insulative housing 10, a spring arm 53 bending and extending upwardly from a side edge of the flat plate 51 and a solder tail 52 extending downwardly from a lower portion of the flat plate 51. The flat plate 51 has a main portion 511 and a slip portion 512 extending upwardly from the main portion 511. The spring arm 52 has a first vertical portion 531 bending from the slit portion 512, an arc portion 532 connected with the first vertical portion 531, a second vertical portion 533 extending from the arc portion 532 and a contact portion extending obliquely from the second vertical portion 533.

The first vertical portion 531 and the second vertical portion 533 are located on a same line and perpendicular to the solder tail 52. The arc portion 532 first extends away from the first vertical portion 531 and then extends towards the first vertical portion 531. The first vertical portion 531, the arc portion 532 and the second vertical portion 533 are located at one side of the slip portion 512. The contact portion extends beyond the slip portion 512 and comprises an oblique portion 534 extending upwardly and obliquely from the second vertical portion 533 and a contact point 535 at a top end thereof.

The contact portion and the arc portion 532 are located at same side of the first vertical portion 531. The first vertical portion 531 and the second vertical portion 533 are located at the same vertical line which not only enhances the flexibility of the electrical contact 20 but also remains the width of the contact 50 unchanged.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

We claim:

1. An electrical connector comprising:
an insulative housing; and
a plurality of electrical contacts secured to the insulative housing, each of the contacts including a flat plate engaging with the insulative housing, a spring arm bending and extending upwardly from a vertical side edge of the flat plate and a solder tail extending downwardly from a lower portion of the flat plate, the spring arm having a first vertical portion connected with the flat plate, an arc portion bending and extending upwardly from the first vertical portion, a second vertical portion extending upwardly from the arc portion, and a contact portion at a free end of the spring arm, the arc portion first extending away from the first vertical portion and then extending towards the first vertical portion; wherein
the contact portion extends from the second vertical portion upwardly and obliquely to a same side of the first vertical portion as the arc portion, and the contact portion extends beyond the arc portion; wherein
the first vertical portion and the second vertical portion are located on a same line; wherein
the flat plate has a main portion and a slip portion extending upwardly from the main portion, and wherein the first vertical portion bent from the slip portion.

2. The electrical connector as claimed in claim 1, wherein the first vertical portion, the arc portion and the second vertical portion are located at one side of the slip portion, and wherein the contact portion extends beyond the slip portion.

3. An electrical connector comprising:
an insulative housing; and
a plurality of electrical contacts secured to the insulative housing, each of the contacts including a flat plate engaging with the insulative housing, a spring arm bending and extending upwardly from a side edge of the flat plate and a solder tail extending downwardly from a lower portion of the flat plate, the spring arm having a first vertical portion connected with the flat plate, an bending portion connected with the first vertical portion, a second vertical portion extending from the bending portion and a contact portion extending obliquely from the second vertical portion, the first vertical portion and the second vertical portion being located on a same line; wherein
the flat plate has a main portion and a slip portion extending upwardly from the main portion, and wherein the first vertical portion bent from the slip portion.

4. The electrical connector as claimed in claim 3, wherein the first vertical portion and the second vertical portion are perpendicular to the solder tail.

5. The electrical connector as claimed in claim 3, wherein the bending portion first extending away from the first vertical portion and then extending towards the first vertical portion.

6. The electrical connector as claimed in claim 3, wherein the first vertical portion, the bending portion and the second vertical portion are located at one side of the slip portion, and wherein the contact portion extends beyond the slip portion.

7. The electrical connector as claimed in claim 3, further comprising a stiffener located at outer side of the insulative housing, a load plate rotatably mounted to one end of the stiffener, and a load lever rotatably mounted to the other end of the stiffener.

* * * * *